United States Patent
Yako et al.

(10) Patent No.: US 6,280,902 B1
(45) Date of Patent: Aug. 28, 2001

(54) POSITIVE WORKING PHOTORESIST COMPOSITIONS COMPRISING A NITROGEN-CONTAINING CYCLIC COMPOUND

(75) Inventors: Yuko Yako, Takatsuki; Naoki Takeyama, Settu, both of (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/584,353

(22) Filed: Jun. 1, 2000

(30) Foreign Application Priority Data

Jun. 3, 1999 (JP) .................................................. 11-156398

(51) Int. Cl.$^7$ ..................................................... G03F 7/039
(52) U.S. Cl. ....................................... 430/270.1; 430/905
(58) Field of Search .................................. 430/270.1, 905

(56) References Cited

U.S. PATENT DOCUMENTS

| | | | |
|---|---|---|---|
| 4,898,806 | * 2/1990 | Pfeifer | 430/325 |
| 5,432,039 | 7/1995 | Bessho et al. | |
| 5,595,856 | * 1/1997 | Mochizuki et al. | 430/270.1 |
| 5,707,776 | 1/1998 | Kawabe | 430/270.1 |
| 5,756,650 | * 5/1998 | Kawamonzen et al. | 528/353 |

FOREIGN PATENT DOCUMENTS

| | | |
|---|---|---|
| 0837368A1 | 4/1988 | (EP) . |
| 0523957A1 | 1/1993 | (EP) . |
| 08432220A | 5/1998 | (EP) . |
| 7271037 | 10/1995 | (JP) . |
| 8262719 | 10/1996 | (JP) . |

OTHER PUBLICATIONS

Derwent Publications Ltd., XP002146927, Feb. 2, 1999 and JP 11–038627–A.
Derwent Publications Ltd., XP002146928, Mar. 20, 1991 and JP 03–064753–A.

* cited by examiner

*Primary Examiner*—John S. Chu
(74) *Attorney, Agent, or Firm*—Birch, Stewart, Kolasch & Birch, LLP

(57) ABSTRACT

A positive working photoresist composition is provided which comprises a resin which is converted to alkali-soluble from alkali-insoluble or alkali slightly soluble by the action of an acid; an acid generator; and a nitrogen-containing cyclic compound represented by the following formula (I):

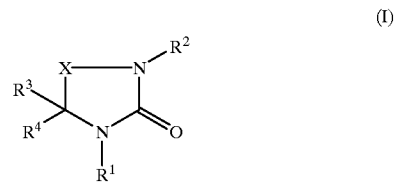

wherein X represents $CH_2$ or $C(=O)$, two of $R^1$, $R^2$, $R^3$ and $R^4$ represent a lower alkyl and the rest two represent hydrogen;

gives a good profile with a smooth pattern side even on a substrate having a high reflection; and has a wide focus margin and a good sensitivity and resolution.

7 Claims, No Drawings

POSITIVE WORKING PHOTORESIST COMPOSITIONS COMPRISING A NITROGEN-CONTAINING CYCLIC COMPOUND

BACKGROUND OF THE INVENTION

The present invention relates to a photoresist composition suitable for lithography utilizing high-energy radiation such as a far ultraviolet ray including eximer laser, electron beam, X-ray, radiation or the like.

Recently, with development of higher integration of an integrated circuit, formation of a submicron pattern is required. Eximer laser lithography has attracted special interest for such a requirement, particularly for it enables production of 64 MDRAM and 256MDRAM. As aresist suitable for such eximer laser lithography process, a so-called chemical amplification type resist has been adopted which utilizes an acid catalyst and chemical amplification effect. In the chemical amplification type resist, solubility of portion irradiated with a radiation in an alkaline developer is changed through a reaction utilizing an acid catalyst generated from an acid generator in the irradiated portion, and by this, a positive or negative pattern is obtained.

In the chemical amplification type positive resist, an acid generated in the irradiated portion diffuses by post heat treatment (post exposure bake: hereinafter, abbreviated as PEB), and acts as a catalyst for changing solubility of irradiated portion in a developer. Such a chemical amplification type positive resist generally comprises a resin component which is alkali-insoluble or alkali slightly soluble by itself, but is converted to alkali-soluble by the action of an acid, and an acid generator which generates an acid by the action of an radiation.

Excimer lasers have a defect that they generate a standing wave formed by interference of t he reflected light and the incident light in a film when they are irradiated on a resist film placed on a substrate having a high reflectivity, because they have a high coherence. For example, when the intensity of the light in a resist film becomes uneven by such a standing wave, a phenomenon occurs in which a side of resist pattern becomes wave-shaped, so-called the standing wave effect. When a side of resist pattern becomes wave-shaped due to the standing wave effect, it is difficult to keep a fixed width of pattern line. In order to suppress the standing wave effect, it is general to suppress the interference in the film by adding a light-absorbing ingredient in the resist. When, however, such a light-absorbing ingredient is used, a problem arises that the light energy in the bottom of the resist film becomes weak and the profile of pattern becomes a tapered shape of a bottom-expanded form. This phenomenon lowers the resolution. In addition, due to the light interference described above, when the light exposure is carried out through a so-called half-tone mask having a small transmittance even at a ask ed part, sometimes a phenomenon (called side lobe) occurs that a perforation that is not present in the mask is formed in an unexposed part. Formation of such a side lobe causes a serious problem in the production of semiconductor integrated circuits.

In addition, generally in the lithography, it is demanded to form a pattern of high fidelity to the original mask pattern even if the focus is somewhat moved during the radiation irradiation. In other words, a photoresist having a deeper depth of focus or a wide focus margin is demanded.

The purpose of the present invention is to provide a positive working photoresist composition which is excellent in various resist properties including sensitivity, resolution, film-forming property, coating property, heat resistance and so on; excellent also in pattern profile and depth of focus; hard to cause standing wave effect in particular, and capable of forming an almost perpendicular and smooth pattern side face even on a substrate having a high reflection. As the result of extensive studies for attaining such purpose, the present inventors have found that a positive working photoresist composition having excellent properties can be obtained by adding a specific compound in the resist together with a resin and an acid-generator. The present invention has been completed based on such fact.

SUMMARY OF THE INVENTION

The present invention provides a positive working photoresist composition which comprises a resin which is converted to alkali-soluble from alkali-insoluble or alkali slightly soluble by the action of an acid; an acid generator; and a nitrogen-containing cyclic compound represented by the following formula (I):

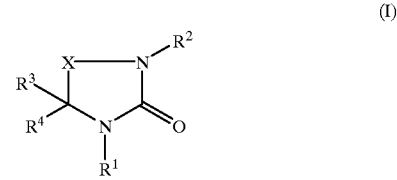

wherein X represents $CH_2$ or $C(=O)$, two of $R^1$, $R^2$, $R^3$ and $R^4$ represent a lower alkyl and the rest two represent hydrogen.

PREFERRED EMBODIMENT OF THE INVENTION

The resin which is a main component of the photoresist component is by itself alkali-insoluble or alkali slightly soluble, and becomes alkali-soluble by a chemical reaction caused by the action of an acid. For example, such a resin can be produced by protecting at least a part of a phenolic hydroxyl group in an alkali soluble resin having a phenol skeleton with a group which has dissolution inhibiting ability against alkaline developers and is insecure against acid.

Examples of the alkali soluble resin used for producing the resin in the resist composition include novolak resins, polyvinylphenol resins, polyisopropenylphenol resins, copolymers of vinylphenol with another vinyl monomer, and copolymers of isopropenylphenol with another vinyl monomer. Examples of the vinyl monomer copolymerized with vinylphenol or isopropenylphenol include (meth)acrylate such as methyl, ethyl, propyl, isopropyl, butyl or cyclohexyl ester of acrylic acid or methacrylic acid, acrylonitrile and styrene. Positional relation between a hydroxy group and a vinyl group or an isopropenyl group in vinylphenol or isopropenylphenol is not particularly limited, although, in general, p-vinylphenol or p-isopropenylphenol is preferred. Hydrogen may also be added to these resins for improving transparency. An alkyl group, alkoxy group and the like may be introduced into a phenol nucleus of the above-described resins, as long as the resulting resin is alkali-soluble. Among these alkali soluble resins, polyvinylphenol-based resins, that is, a homopolymer of vinylphenol or copolymer of vinylphenol with other monomer are preferably used.

The group to be introduced in the alkali soluble resin which has dissolution inhibiting ability against an alkali developer and is insecure against acid can be selected from various known protecting groups. Examples thereof include a tert-butoxycarbonyl group, tert-butoxycarbonylmethyl group, tetrahydro-2-pyranyl group, tetrahydro-2-furyl group, methoxymethyl group, 1-ethoxyethyl group, 1-propoxyethyl group, 1-(2-methylpropoxy)ethyl group and 1-ethoxypropyl group. These groups shall be substituted for hydrogen on a phenolic hydroxyl group. Among these protecting groups, particularly, 1-alkoxyalkyl group is preferred. Examples of the preferred 1-alkoxyalkyl group include 1-ethoxyethyl group, 1-propoxyethyl group, 1-(2-methylpropoxy)ethyl group and 1-ethoxypropyl group. The ratio of the phenolic hydroxyl groups substituted by the protecting group to the all phenolic hydroxyl groups in the alkali soluble resin (protective group introducing ratio) is preferably from 10 to 50%, in general. In the present invention, it is preferable to use a polyvinylphenol resin among those described above in which a part of the phenolic hydroxyl group is protected by the one or more kinds of 1-alkoxyalkyl groups selected from those mentioned above, as a part or whole of the resin component in the resist composition of the present invention.

The acid generator in the resist composition of the present invention can be selected from various compounds which generate an acid by irradiation to the substance itself or to a resist composition containing the substance. The acid generator can be used as a single compound or a mixture of two or more thereof. Examples thereof include onium salts such as sulfonium salt and iodonium salt, organic halogen compounds, particularly haloalkyl-s-triazine compound, compounds having a diazomethanedisulfonyl skeleton, disulfone compounds having an aromatic group, sulfone compounds, orthoquinone diazide compounds and sulfonic acid ester compounds such as a sulfonic acid ester of a compound having an aromatic group and a sulfonic acid ester of N-hydroxyimide. More specific examples of the acid-generators suitably used in the present invention include following compounds:

(a) Compounds having a diazomethane sulfonyl skeleton:
bis(phenylsulfonyl)diazomethane,
bis(4-chlorophenylsulfonyl)diazomethane,
bis(p-toluenelsulfonyl)diazomethane,
bis(4-tert-butylphenylsulfonyl)diazomethane,
bis(2,4-dimethylphenylsulfonyl)diazomethane,
bis(cyclbhexanesulfonyl)diazomethane,
bis(tert-butanesulfonyl)diazomethane and the like;

(b) Onium salts:
triphenylsulfonium tosylate,
(4-methylphenyl)diphenylsulfonium tosylate,
(4-methylphenyl)diphenylsulfonium triflate,
(4-methylphenyl)diphenylsulfonium perfluorobutanesulfonate,
(4-methylphenyl)diphenylsulfonium perfluorooctanesulfonate,
(4-tert-butylphenyl)diphenylsulfonium tosylate,
tris(4-methylphenyl)sulfonium tosylate,
bis(4-methylphenyl)iodonium tosylate,
bis(4-methylphenyl)iodonium 10-camphorsulfonate, and the like, (c) Other compounds:
N-(methanesulfonyloxy)succinimide,
N-(propanesulfonyloxy)succinimide,
N-(butanesulfonyloxy)succinimide,
N-(phenylsulfonyloxy)succinimide,
N-(10-camphorsulfonyloxy)succinimide,
diphenyldisulfone,
2,4,6-tris(trichloromethyl)-1,3,5-triazine,
α-phenylsulfonylacetophenone,
α-methylsulfonylacetophenone, and the like.

In addition to the resin and acid generator, the photoresist composition of the present invention comprises a nitrogen-containing cyclic compound represented by the formula (I) described above. The nitrogen-containing cyclic compound represented by the formula (I) is a compound comprising two nitrogen atoms and three carbon atoms as ring-forming atoms and one or two of these carbon atoms are in the form of carbonyl groups. In the formula (I), two of $R^1$, $R^2$, $R^3$ and $R^4$ are a lower alkyl and the rest two are hydrogen. The lower alkyl here may be a group having about 1 to 4 carbon atoms such as methyl, ethyl, propyl or butyl. Among them, methyl or ethyl are preferred and methyl is particularly preferred. By adding such a nitrogen-containing cyclic compound, formation of a wave-shaped pattern side is inhibited and a pattern having a smooth side is obtained. As the nitrogen-containing cyclic compound, known compounds or commercially available compounds can be used. Specific examples of the compounds include 1,3-dimethyl-2-imidazolidinone which is a compound of the formula (I) wherein X is $CH_2$, $R^1$ and $R^2$ are respectivelymethyl and $R^3$ and $R^4$ are respectively hydrogen, and 5,5-dimethylhydantoin which is a compound of the formula (I) wherein X represents $C(=O)$, $R^1$ and $R^2$ are respectively hydrogen and $R^3$ and $R^4$ are respectively methyl. The nitrogen-containing cyclic compound of the formula (I) may be used singly or as a combination of two or more thereof.

In the resist composition of chemical amplification type, it is generally known that a change in performance, so-called time-delay effect, may occur by inactivation of an acid generated in a resist caused by a small amount of ammonia or amines existing in the surrounding atmosphere depending on a standing period from the time of irradiation of radiation to the time of PEB. In order to prevent this inactivation of acid, it is known to add a basic organic compound, specifically an amine compound, as a quencher. It is preferred that the photoresist composition of the present invention further comprises such an amine compound as a quencher. Particularly, a compound having a tertiary amino group, that is, a tertiary amine, is preferred as the quencher. The amine compound used as a quencher is preferably a compound which is not evaporated at a temperature for prebaking, so that it remains in the resist film and exhibits the effect after prebaking the resist film formed on the substrate. Generally, a compound having a boiling point of 150° C. or above is used.

Examples of the amine compound suitable for use in the present invention include tributylamine, trihexylamine, trioctylamine, tris(2-ethylhexyl)amine, N,N-dimethylbenzylamine, triisopropanolamine, N-methyldiocttylamine, N-methyldicyclohexylamine and tris[2-(2-methoxyethoxy)ethyl] amine. In addition, it is effective to use an organic quaternary ammonium salt such as tetrabutyl ammonium hydroxide together with the above described amine.

Preferably, the amount of the resin is from about 50 to 99% by weight, the amount of the acid-generator is from about 0.05 to 20% by weight, the amount of the nitrogen-containing cyclic compound represented by the formula (I) is from about 0.01 to 20% by weight based on the weight of total solid component of this composition. The amount of the amine and organic quaternary ammonium salt, used as a quencher, is preferably from about 0.001 to 10% by weight based on the weight of total solid component of th,s composition. The photoresist composition of the present invention may optionally comprise other components, for example, various additives conventionally used in this field such as a dissolution inhibitor, sensitizers, dye, adhesion improver and electron donor.

A resist solution is prepared by mixing the above respective components with a solvent so that the concentration of the total solid content in the resist solution is within the range from 10 to 50% by weight. The solution is coated on a substrate such as silicon wafer according to a conventional method, by spin coating or the like. The solvent used may be any one which can dissolve the respective components and may be those which are normally used in this field. Examples thereof include glycol ether esters such as ethylcellosolve acetate, methylcellosolve acetate, propylene glycol monomethyl ether acetate and propylene glycol monoethyl ether acetate, glycol mono or diethers such as ethylcellosolve, methylcellosolve, propylene glycol monometyl ether, propylene glycol monoethyl ether and diethylene glycol dimethyl ether, esters such as ethyl lactate, butyl lactate and ethyl pyruvate, ketones such as 2-heptanone, cyclohexanone and methyl isobutyl ketone, and aromatic hydrocarbons such as xylene. These solvents may be used singly or as a combination of two or more thereof.

A positive pattern is formed from the resist film coated on a substrate, usually via respective processes such as prebaking, patterning exposure, PEB, developing with an alkali developer. The alkaline developer may be of various kinds used in this field. Examples of the developer generally used include aqueous solution of tetramethyl ammonium hydroxide or (2-hydroxyethyl) trimethyl ammonium hydroxide (common name: choline).

The following example further illustrates the present invention in detail, but does not limit the scope thereof. In example, reference example and comparative example, all "part" or "parts" is by weight unless otherwise stated. The weight average molecular weight herein refers to a value measured by gel permeation chromatography (GPC) using polystyrene as the standard.

REFERENCE EXAMPLE (Protection of resin)

Into a 500-ml four-necked flask purged by nitrogen gas were charged 25 g (208 m-moles, converted to p-vinylphenol unit) of poly(p-vinylphenol) having a weight average molecular weight (Mw) of 23,900 and a molecular weight distribution (Mw/Mn) of 1.12 ["VP-15000", manufactured by Nippon Soda] and 0.021 g (0.109 m-mole) of p-toluenesulfonic acid. They were dissolved in 250 g of 1,4-dioxane. To this solution was added dropwise 8.56 g (118 m-moles) of ethyl vinyl ether and a reaction was carried out at 25° C. for 5 hours. Then, the reaction solution was added dropwise to 1,500 ml of ion-exchanged water and the mixture was filtered to give a white wet cake. The wet cake was dissolved in 200 ml of 1,4-dioxane. Then the solution was added dropwise to 1,500 ml of ion-exchanged water and filtered. The obtained cake was washed in 600 g of ion-exchanged water with agitation and the mixture was filtered to separate a wet cake. The washing procedure with ion-exchanged waterwasrepeatedtwice. The obtained white wet cake was dried under an reduced pressure to give a resin in which hydroxyl groups in poly(vinylphenol) are partially converted to 1-ethoxyethyl ether. Analysis by $^1$H-NMR revealed that 38% of hydroxyl groups was converted to 1-ethoxyethyl ether. The resin had a weight average molecular weight of 31,200 and a molecular weight distribution of 1.17.

Example 1

Ingredients were mixed in the following composition and filtered through a fluorine resin filter having a pore diameter of 0.1 μm to form a resist solution.

Resin:

| | |
|---|---|
| the resin produced in Reference Example, | 13.5 parts |
| Acid generator: | |
| bis(cyclohexanesulfonyl)diazomethane, | 0.42 part |
| (4-methylphenyl)diphenylsulfonium perfluorooctanesulfonate, | 0.08 part |
| Quencher: N-methyldicyclohexylamine, | 0.012 part |
| Additive: 1,3-dimethyl-2-imidazolidinone, | 1.0 part |
| Solvent: | 70 parts |
| propyleneglycol monomethyl ether acetate, | |

Onto a silicon wafer washed according to the conventional manner, the resist solution described above was coated with a spin-coater so that the film thickness after drying was 0.7 μm. Then the silicon wafer was prebaked on a hot plate at 90° C. for 60 seconds. The coating film was light-exposed through a chromium mask having a hole pattern changing stepwise the exposure amount using a KrF excimer laser stepper having a wave length for exposure of 248 nm ["NNSR 2205 EX12B", NA=0.55, manufactured by Nikon]. After exposure, PEB was carried out at 105° C. for 60 seconds on a hot plate to effect a reaction for removing the protective group at the exposed part. The development was effected with 2.38% (by weight) aqueous tetramethylammonium hydroxide solution to give a positive working pattern. The obtained pattern was observed under an electronic microscope and the sensitivity, depth of focus, and roughness of pattern side were evaluated by the methods shown below. The results are shown in Table 1.

Sensitivity at 0.20 μm: This is expressed by the minimum light exposure which resolves a fine hole pattern having a diameter of 0.20 μm.

Depth of focus at 0.20 μm: This is expressed by the range of focus which resolves a hole pattern having a diameter of 0.20 μm in the same diameter as that of the mask when the exposure is carried out with the light exposure amount of the sensitivity at 0.20 μm changing the position of focus upward or downward and then PEB and development are performed.

Roughness of side: This is expressed by the depth of unevenness which is the depth of the standing wave (wave-shaped unevenness) formed on the side wall observed in a photograph under an electronic microscope of the cross section of pattern.

Example 2

A resist solution was prepared in a same manner as that in Example 1 except that the resist composition was changed as described below. The product was evaluated by the same way. The results are also shown in Table 1.

Resin:

| | |
|---|---|
| the resin produced in Reference Example, | 13.5 parts |
| Acid generator: | |
| bis(cyclohexanesulfonyl)diazomethane, | 0.4 part |
| (4-methylphenyl)diphenylsulfonium perfluorooctanesulfonate, | 0.1 part |
| Quencher: N-methyldicyclohexylamine, | 0.008 part |
| tetrabutylammoniumhydroxide | 0.004 part |
| Additive: 1,3-dimethyl-2-imidazolidinone, | 1.0 part |
| Solvent: | 70 parts |
| propyleneglycol monomethyl ether acetate, | |

Example 3

A resist solution was prepared in a same manner as that in Example 1 except that the resist composition was changed as described below. The product was evaluated by the same way. The results are also shown in Table 1.

Resin:

| | |
|---|---|
| the resin produced in Reference Example, | 13.5 parts |
| Acid generator: | |
| bis(cyclohexanesulfonyl)diazomethane, | 0.42 part |
| (4-methylphenyl)diphenylsulfonium perfluorooctanesulfonate, | 0.08 part |
| Quencher: N-methyldicyclohexylamine, | 0.012 part |
| Additive: 5,5-dimethylhydantoin, | 0.5 part |
| Solvent: | 70 parts |
| propyleneglycol monomethyl ether acetate, | |

Comparative Example

A resist solution was prepared in a same manner as that in Example 1 except that the resist composition was changed as described below. The resist composition is the same as that in Example 1 or Example 3 except that 1,3-dimethyl-2-imidazolidinone or 5, 5-dimethylhydantoin was not added. The product was evaluated by the same way. The results are also shown in Table 1.

Resin:

| | |
|---|---|
| the resin produced in Reference Example, | 13.5 parts |
| Acid generator: | |
| bis(cyclohexanesulfonyl)diazomethane, | 0.42 part |
| (4-methylphenyl)diphenylsulfonium perfluorooctanesulfonate, | 0.08 part |
| Quencher: N-methyldicyclohexylamine, | 0.012 part |
| Solvent: | 70 parts |
| propyleneglycol monomethyl ether acetate, | |

TABLE 1

| | Example 1 | Example 2 | Example 3 | Comparative Example |
|---|---|---|---|---|
| Sensitivity at 0.20 μm | 59 mJ/cm² | 42 mJ/cm² | 50 mJ/cm² | 42 mJ/cm² |
| Depth of focus at 0.20 μm | 1.4 μm | 1.4 μm | 1.4 μm | 1.0 μm |
| Roughness of side | 5 nm | 5 nm | 7 nm | 20 nm |

As apparent from Table 1, the compositions of Examples containing a nitrogen-containing cyclic compound according to the present invention gave a pattern having less (wave-shaped) unevenness on side due to the standing wave effect, and the pattern side was almost smooth as observed under electronic microscope. In addition, the product had an enlarged depth of focus.

Example 4

Ingredients were mixed in the following composition and filtered through a fluorine resin filter having a pore diameter of 0.1 μm to form a resist solution.

Resin:

| | |
|---|---|
| the resin produced in Reference Example, | 13.5 parts |
| Acid generator: | |
| bis(cyclohexanesulfonyl)diazomethane, | 0.42 part |
| (4-methylphenyl)diphenylsulfonium perfluorooctanesulfonate, | 0.08 part |
| Quencher: N-methyldicyclohexylamine, | 0.008 part |
| tetrabutylammoniumhydroxide | 0.004 part |
| Additive: 5,5-dimethylhydantoin, | 0.5 part |
| Solvent: | 70 parts |
| propyleneglycol monomethyl ether acetate, | |

A coated film was formed in a same manner as that in Example 1 using the resist solution. Then, the film was light-exposed through a half-tone mask having a pattern (transmittance at the masked part: 6%) changing stepwise the exposure amount using the same KrF excimer laser stepper as that used in Example 1. After exposure, PEB and development were carried out in the same manner as those in Example 1. The obtained pattern was observed under an electronic microscope. The result showed that the 0.22 μm fine hole pattern was resolved with a good profile at an exposure of 62 mJ/cm². The depth of focus at this exposure was 1.0 μm. In addition, the pattern had a smooth side and no side lobe (a phenomenon in which a perforation that is not present in the mask is formed in an unexposed part) was observed.

The positive working photoresist composition containing a specific nitrogen-containing cyclic compound according to the present invention gives a good profile with a smooth pattern side even on a substrate having a high reflection. Further, it has a wide focus margin and a good sensitivity and resolution. Therefore, a photoresist pattern of high accuracy and fineness can be formed by using this composition.

What is claimed is:

1. A positive working photoresist composition which comprises a resin which is converted to alkali-soluble from alkali-insoluble or alkali slightly soluble by the action of an acid; an acid generator; and a nitrogen-containing cyclic compound represented by the following formula (I):

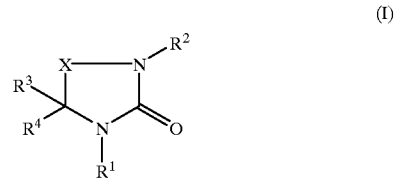

(I)

wherein X represents $CH_2$ or $C(=O)$, two of $R^1$, $R^2$, $R^3$ and $R^4$ represent a lower alkyl and the rest two represent is hydrogen.

2. The positive working photoresist composition according to claim 1 wherein the resin which is converted to alkali-soluble from alkali-insoluble or alkali slightly soluble by the action of an acid comprises a polyvinylphenol resin in which a part of the phenolic hydroxyl group is protected by a 1-alkoxyalkyl group.

3. The positive working photoresist composition according to claim 2 wherein the 1-alkoxyalkyl group is selected from 1-ethoxyethyl group, 1-propoxyethyl group, 1-(2-methylpropoxy)ethyl group and 1-ethoxypropyl group.

4. The positive working photoresist composition according to claim 1 wherein the nitrogen-containing cyclic compound is 1,3-dimethyl-2-imidazolidinone.

5. The positive working photoresist composition according to claim 1 wherein the nitrogen-containing cyclic compound is 5,5-dimethylhydantoin.

6. The positive working photoresist composition according to claim 1 which further comprises an amine compound as a quencher.

7. The positive working photoresist composition according to claim 6 wherein the amine is a tertiary amine.

\* \* \* \* \*